United States Patent [19]

Kobayashi et al.

[11] Patent Number: 5,130,270
[45] Date of Patent: Jul. 14, 1992

[54] HETERO-EPITAXIAL LIQUID PHASE GROWTH METHOD

[75] Inventors: Masatoshi Kobayashi; Yoshiharu Komine, both of Itami, Japan

[73] Assignee: Mitsubishi Denki Kabushiki Kaisha, Tokyo, Japan

[21] Appl. No.: 567,109

[22] Filed: Aug. 14, 1990

[30] Foreign Application Priority Data

Apr. 19, 1990 [JP] Japan .................. 2-104037

[51] Int. Cl.$^5$ ......................... H01L 21/208
[52] U.S. Cl. ..................... 437/120; 437/126; 437/128; 437/130; 148/DIG. 101
[58] Field of Search ............... 437/119, 120, 126, 128, 437/130, 108, 110; 148/DIG. 101

[56] References Cited

U.S. PATENT DOCUMENTS

| | | | |
|---|---|---|---|
| 3,972,753 | 8/1976 | Legros et al. | 437/120 |
| 4,268,327 | 5/1981 | Uragaki et al. | 437/120 |
| 4,315,477 | 2/1982 | Wang et al. | 437/130 |
| 4,317,689 | 3/1982 | Bowers et al. | 437/120 |
| 4,401,487 | 8/1983 | Lockwood | 437/120 |
| 4,470,368 | 9/1984 | Reynolds, Jr. et al. | 118/412 |
| 4,642,142 | 2/1987 | Harman | 437/120 |
| 4,798,812 | 1/1989 | Wilson | 437/120 |
| 4,906,325 | 3/1990 | Bernardi | 437/120 |

FOREIGN PATENT DOCUMENTS

| | | | |
|---|---|---|---|
| 0295659 | 12/1899 | European Pat. Off. | |
| 0311038 | 4/1989 | European Pat. Off. | |
| 0096629 | 7/1980 | Japan | 437/120 |
| 0131737 | 8/1983 | Japan | 437/130 |
| 63-307199 | 12/1988 | Japan. | |
| 2138697 | 10/1984 | United Kingdom. | |

Primary Examiner—Mary Wilczewski
Attorney, Agent, or Firm—Leydig, Voit & Mayer

[57] ABSTRACT

A hetero-epitaxial liquid phase growth method for growing a compound semiconductor by liquid phase epitaxy includes placing a melt in a closed melt boat on a substrate and epitaxially growing a first thin film, opening the melt boat while the melt remains in a melted state for a predetermined time to evaporate a component of the melt, and epitaxially growing a second thin film on the first thin film from the melt from which the component has been evaporated.

3 Claims, 3 Drawing Sheets

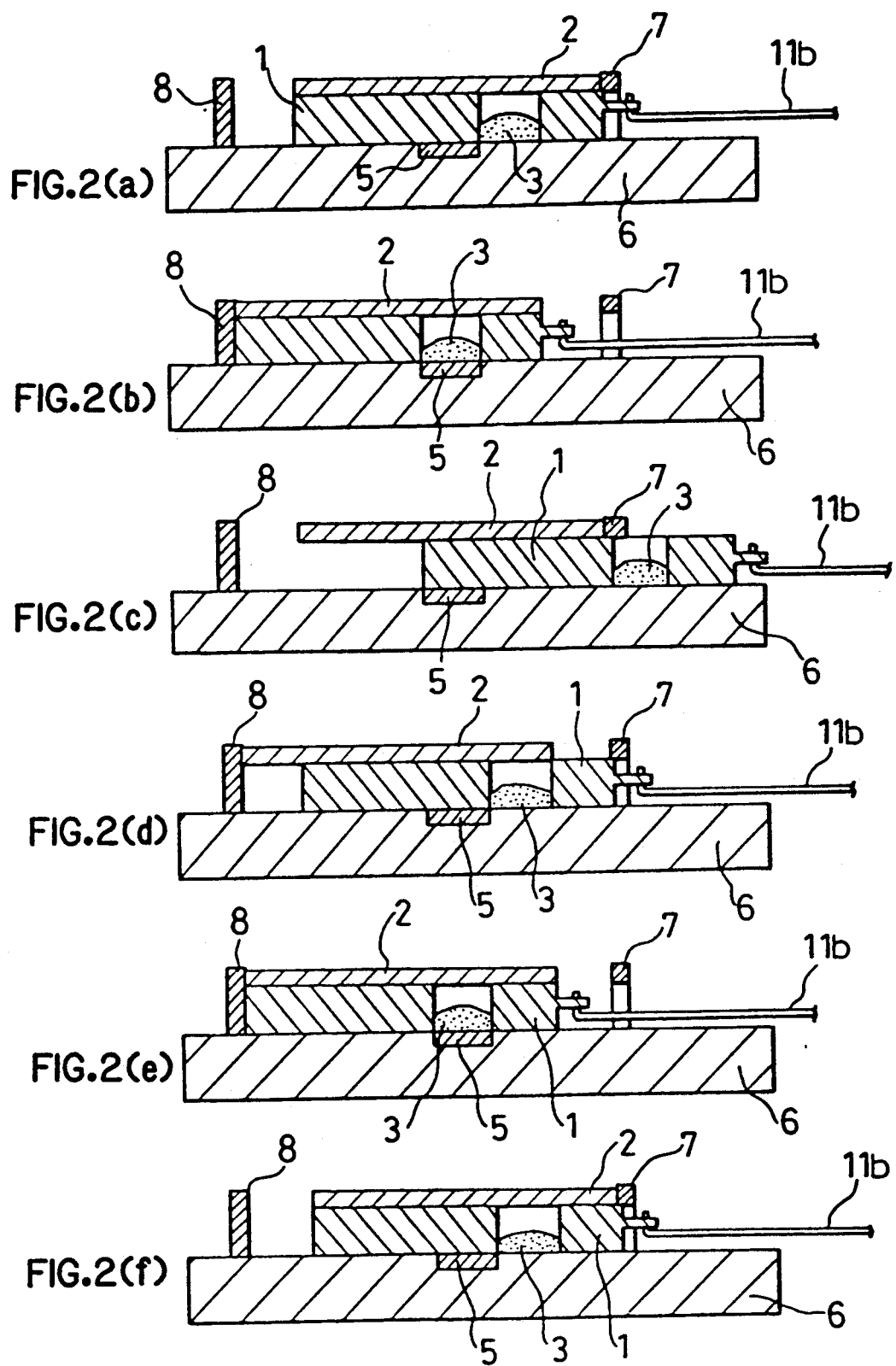

HETERO-EPITAXIAL LIQUID PHASE GROWTH METHOD

FIELD OF THE INVENTION

The present invention relates to a hetero-epitaxial liquid phase growth method for growing compound semiconductors by a liquid phase epitaxy to produce hetero-epitaxial layers.

BACKGROUND OF THE INVENTION

FIG. 4 shows a prior art liquid phase crystal growth apparatus for hetero-epitaxial liquid phase growth. In FIG. 4, reference numeral 1 designates a melt boat and a lid 2 is provided on the melt boat 1 to enclose the boat 1. Reference numeral 3 designates a first melt of a compound semiconductor contained in the first compartment of the boat 1 and reference numeral 4 designates a second melt of a compound semiconductor having a composition different from the first melt 3 contained in the second compartment of the boat 1. Reference numeral 6 designates a mother boat and reference numeral 5 designates a substrate placed in a concave part on the surface of the mother boat 6. Reference numeral 9 designates a quartz tube heated by a heater 10. Reference numerals 11a and 11b designate moving rods for moving the mother boat 6 and the melt boat 1, respectively.

FIGS. 5(a)–(d) show a prior art hetero-epitaxial liquid phase growth method.

FIG. 5(a) illustrates a temperature adjustment. The first melt 3 and the second melt 4 are airtightly enclosed by the melt boat 1 and the lid 2. The melts are positioned to one side of the substrate 5, which is placed on the mother boat 6, and are held in the melted state for a predetermined time.

Next, the entire boat, including the melt boat 1 and the mother boat 6, is cooled to lower its temperature at a predetermined speed, and when it reaches a predetermined temperature, the melt boat 1 is pushed by the moving rod 11b to the position shown in FIG. 5(b) such that the first melt 3 contacts the substrate 5. Then, a first epitaxial thin film is grown on the substrate 5.

Next, the melt boat 1 is pushed further by the moving rod 11b to the position shown in FIG. 5(c) such that the second melt 4 contacts the substrate 5 on which the first epitaxial thin film has been grown. Then, a second epitaxial thin film is grown on the first epitaxial thin film.

Finally, the melt boat 1 is pushed further by the moving rod 11b to the position shown in FIG. 5(d), and the substrate 5 is separated from the first and second melt 3 and 4, thereby completing the growth.

In this prior art example, the first thin film is epitaxially grown by using the first melt 3 and the second thin film is epitaxially grown by using the second melt 4.

In the prior art hetero-epitaxial liquid phase growth method, it is necessary to prepare a plurality of melts having different compositions for the hetero-epitaxial growth. Therefore, the melt production requires a lot of work and the materials are expensive.

SUMMARY OF THE INVENTION

The present invention is directed to solving the above problems and its object is to provide a hetero-epitaxial liquid phase growth method that uses only one melt.

Other objects and advantages of the present invention will become apparent from the detailed description given hereinafter. It should be understood, however, that the detailed description and specific embodiments are given by way of illustration only, since various changes and modifications within the spirit and scope of the invention will become apparent from the detailed description.

In accordance with a hetero-epitaxial liquid phase growth method of the present invention, after a first thin film is epitaxially grown by contacting a melt with a substrate, a predetermined quantity of an easily evaporating component in the melt is evaporated by opening the lid of the melt boat for a predetermined time. Thereafter, the melt is again contacted with the substrate and a second thin film is epitaxially grown.

The composition of the melt changes by the evaporation of a predetermined quantity of an easily evaporating melt component, and a second thin film of different composition from the first can be hetero-epitaxially grown using only one melt.

BRIEF DESCRIPTION OF THE DRAWINGS

FIGS. 2(a) to 2(f) are cross-sectional views showing a hetero-epitaxial liquid phase growth method according to an embodiment of the present invention;

DETAILED DESCRIPTION OF THE PREFERRED EMBODIMENTS

Figure 1:
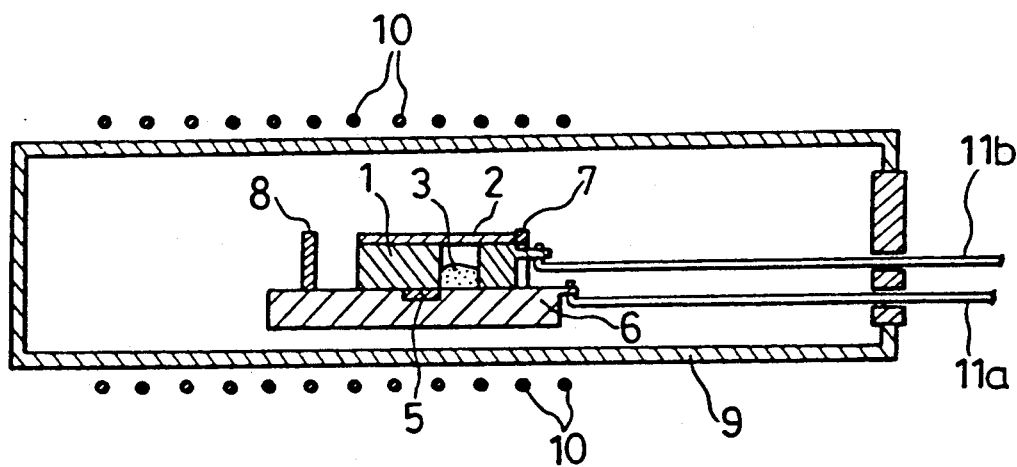
FIG. 1 is a cross-sectional view showing a liquid phase crystal growth apparatus used in a hetero-epitaxial liquid phase growth method according to an embodiment of the present invention.
Figure 4:
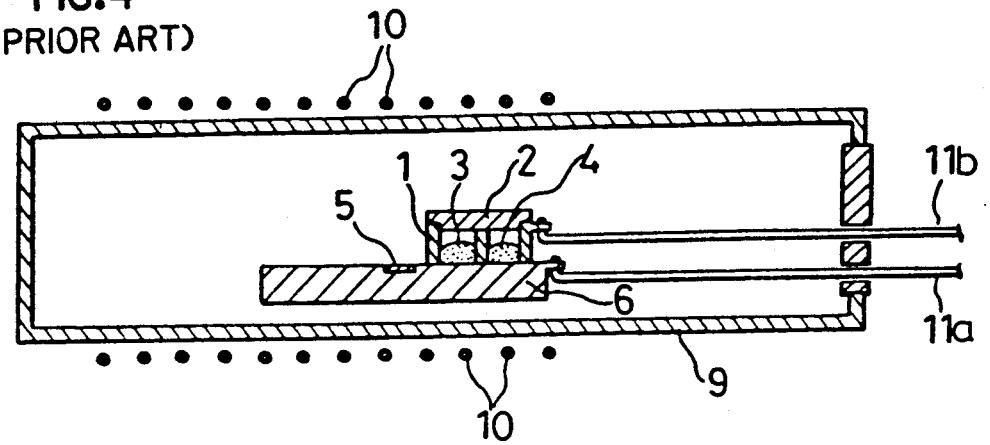
FIG. 4 is a cross-sectional view showing a liquid phase crystal growth apparatus used in a prior art hetero-epitaxial liquid phase growth method.
Figure 5A:
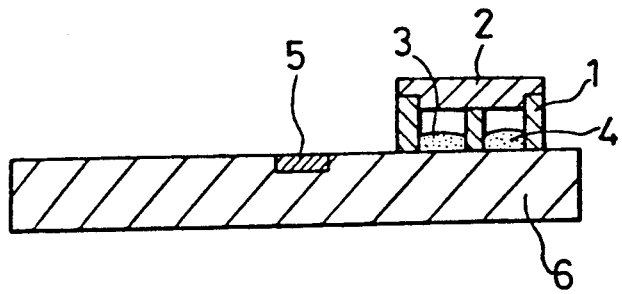
FIGS. 5(a) to 5(d) are cross-sectional views showing a prior art hetero-epitaxial liquid phase growth method.
Figure 5B:
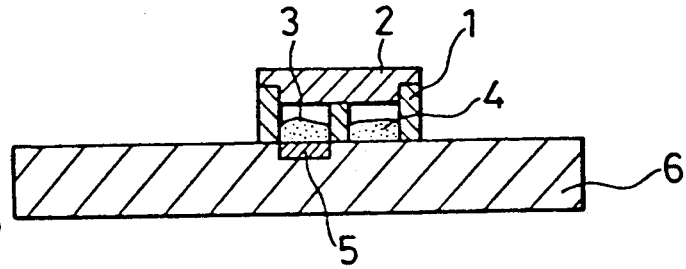
Figure 5C:
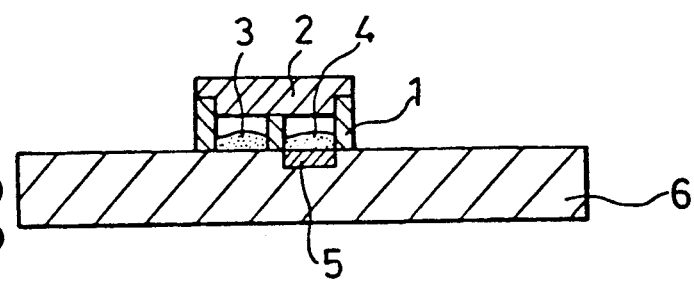
Figure 5D:
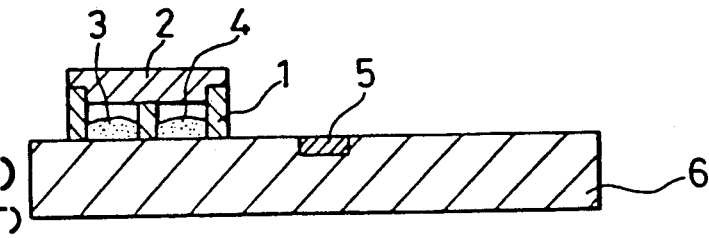

FIG. 1 is a cross-sectional view showing a liquid phase crystal growth apparatus used in a hetero-epitaxial liquid phase growth method according to an embodiment of the present invention. In FIG. 1, the same reference numerals as those shown in FIG. 4 designate the same or corresponding portions. Reference numeral 7 designates a gate-shaped lid stop which stops the lid 2 but allows passage of the melt boat 1. Reference numeral 8 designates a stop that stops both the melt boat 1 and the lid 2.

FIGS. 2(a)–2(f) are diagrams showing the processes of a hetero-epitaxial liquid phase growth method according to an embodiment of the invention. The same reference numerals as those shown in FIG. 1 designate the same or corresponding elements.

FIG. 2(a) illustrates a temperature adjustment. The melt 3 is airtightly enclosed by the melt boat 1 and the lid 2 which is located to one side of the substrate 5 and placed on the mother boat 6. Melt 3 is kept melted for a predetermined time. Next, the entire boat, that is, the mother boat 6 and the melt boat 1, is cooled at a constant speed to lower the temperature of the melt. When the melt reaches a predetermined temperature, the melt boat 1 is pushed by the moving rod 11b to the position shown in FIG. 2(b) so that the melt 3 contacts the substrate 5. Then, a first epitaxial thin film is grown on the substrate 5.

Next, the melt boat 1 is pulled by the moving rod 11b to the position shown in FIG. 2(c). There, the substrate 5 and the melt 3 are separated and the first growth is completed. Then, the lid 2, stopped by the lid stop 7, is opened as shown in FIG. 2(c). An easily evaporating component is evaporated from the melt 3. The melt boat 1 and melt 3 are held in this state for a predetermined time and, thereafter, the melt boat 1 is pushed by the moving rod 11b to the position shown in FIG. 2(d).

In FIG. 2(d), the lid 2 is stopped lid stop 8 so that the lid 2 again covers the boat 1, and the melt 3 is airtightly enclosed. The melt 3 is further cooled to lower its temperature, and, after the melt 3 from which a quantity of easily evaporating component has been evaporated reaches a solid/liquid equilibrium state with the first thin film, the melt boat 1 is further pushed by the moving rod 11b to the position shown in FIG. 2(e). In FIG. 2(e), the melt 3 is again positioned on the substrate 5 and a second thin film is epitaxially grown on the first thin film.

Finally, the melt boat 1 is further pulled by the moving rod 11b to the position shown in FIG. 2(f) and the substrate 5 is separated from the melt 3, thereby completing the growth.

In this embodiment, in the state of FIG. 2(c), a quantity of the easily evaporating component of the melt 3 is evaporated and the composition of melt 3 changes. Therefore, the composition of the first thin film and that of the second thin film are different, thereby resulting in a hetero-epitaxial growth. For example, a p-type mercury cadmium telluride film having a mole ratio of mercury to cadmium of 0.8:0.2 is first epitaxially grown on the semi-insulating CdTe subatrate and, second, a p-type mercury cadmium telluride having a mole ratio of mercury to cadmium of 0.78:0.22 is epitaxially grown on the first film to produce an infrared detector. When a melt of mercury cadmium telluride having a mole ratio of mercury to cadmium of 0.8:0.2 is used, mercury, which is the easily evaporating component of the melt, is evaporated from the melt as described above, and then the mole ratio of mercury to cadmium of the melt becomes 0.78:0.22. Then, by growing the first layer for about 30 minutes at a temperature of 480° C., a thin film of mercury cadmium telluride about 20 microns thick is produced. After a quantity of mercury is evaporated from the melt by opening the lid for several minutes, the melt is again brought into contact with the CdTe substrate on which a $Cd_{0.2}Hg_{0.8}Te$ of about 20 microns is epitaxially grown. The second crystal growth is carried out for about 15 minutes, thereby producing a $Cd_{0.22}Hge_{0.78}Te$ thin film.

Figure 3:
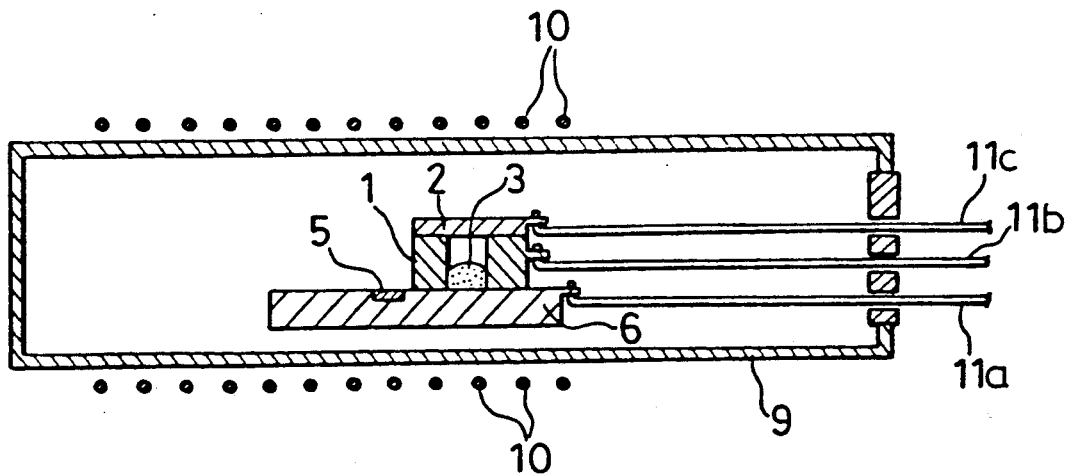
FIG. 3 is a cross-sectional view showing an alternative liquid phase crystal growth apparatus used in a hetero-epitaxial liquid phase growth method according to an embodiment of the present invention.

While in the above-illustrated embodiment the lid stop 7 and the melt boat 1 and lid stop 8 are used to open or close the lid 2, the lid 2 can be opened or closed by sliding the lid 2 with a moving rod 11c as shown in FIG. 3.

As is evident from the foregoing description according to the present invention, in a hetero-epitaxial liquid phase growth method, after a first thin film is epitaxially grown, a predetermined quantity of an easily evaporating component of the melt is evaporated and, thereafter, the melt is again placed on the substrate to grow an epitaxial second thin film. Therefore, the composition of the melt is changed by evaporating a predetermined quantity of the easily evaporating component in the melt, and a second thin film of different composition from the first can be hetero-epitaxially grown using one melt. Therefore, melt production is simplified and the cost of materials is also reduced.

What is claimed is:

1. A hetero-epitaxial liquid phase growth method for growing hetero-epitaxial layers comprising:

placing a melt of a first compound semiconductor material including at lest two elemental components contained in a closed melt boast on a substrate and epitaxially growing a first thin film of the first compound semiconductor on the substrate from the melt by liquid phase epitaxy;

removing the melt of the first compound semiconductor material from the first thin film;

opening the melt boast, while the melt remains in a melted state, for a predetermined time to evaporate some of one of the elemental components of the melt of the first compound semiconductor whereby a melt of a second compound semiconductor, different in composition from the first compound semiconductor, is produced;

closing the melt boat; and placing the melt of the second compound semiconductor on the first thin film and epitaxially growing a second thin film of the second compound semiconductor on the first thin film from the melt by liquid phase eptitaxy of the second compound semiconductor.

2. A hetero-epitaxial liquid phase growth method for growing hetero-epitaxial layers of mercury cadmium telluride on a cadmium telluride substrate comprising:

placing a mercury cadmium telluride melt contained in a closed boat on a substrate and epitaxially growing a first mercury cadmium telluride thin film on the substrate by liquid phase epitaxy;

opening the melt boat, while the melt of the mercury cadmium telluride remains in a melted state, for a predetermined time to evaporate a predetermined quantity of mercury from the melt to decrease the mole ratio of mercury to cadmium in the mercury cadmium telluride melt; and closing the melt boat;

epitaxially growing a second mercury cadmium telluride thin film on the first thin film of mercury cadmium telluride by liquid phase epitaxy from the mercury cadmium telluride melt having a decreased ration of mercury to cadmium.

3. The method of claim 2 including removing the mercury cadmium telluride melt from the substrate before opening the melt boat, closing the melt boat after evaporating mercury from the melt, and placing the mercury cadmium telluride melt having a decreased mole ratio of mercury to cadmium on the first thin film of mercury cadmium telluride.

* * * * *

UNITED STATES PATENT AND TRADEMARK OFFICE
CERTIFICATE OF CORRECTION

PATENT NO. : 5,130,270

DATED : July 14, 1992

INVENTOR(S) : Kobayashi et al.

It is certified that error appears in the above-identified patent and that said Letters Patent is hereby corrected as shown below:

Claim 1, column 4, line 13, change "lest" to --least--;

Claim 1, column 4, line 14, change "boast" to --boat--;

Claim 1, column 4, line 20, change "boast" to --boat--;

Claim 2, column 4, line 51, chagne "ration" to --ratio--.

Signed and Sealed this

Fourteenth Day of September, 1993

Attest:

BRUCE LEHMAN

*Attesting Officer*     *Commissioner of Patents and Trademarks*